United States Patent
Takenaga et al.

(10) Patent No.: US 9,461,210 B2
(45) Date of Patent: Oct. 4, 2016

(54) LIGHT EMITTING ELEMENT AND LIGHT EMITTING DEVICE USING THE SAME

(71) Applicant: NICHIA CORPORATION, Anan-shi, Tokushima (JP)

(72) Inventors: Koichi Takenaga, Anan (JP); Hirofumi Kawaguchi, Tokushima (JP); Kazuki Kashimoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/669,345

(22) Filed: Mar. 26, 2015

(65) Prior Publication Data

US 2015/0280071 A1     Oct. 1, 2015

(30) Foreign Application Priority Data

Mar. 28, 2014   (JP) .................................. 2014-069816

(51) Int. Cl.
| | |
|---|---|
| *H01L 33/00* | (2010.01) |
| *H01L 33/38* | (2010.01) |
| *H01L 33/62* | (2010.01) |
| *H01L 33/40* | (2010.01) |
| *H01L 33/44* | (2010.01) |
| *H01L 33/54* | (2010.01) |

(52) U.S. Cl.
CPC .......... *H01L 33/387* (2013.01); *H01L 33/382* (2013.01); *H01L 33/40* (2013.01); *H01L 33/44* (2013.01); *H01L 33/54* (2013.01); *H01L 33/62* (2013.01)

(58) Field of Classification Search
CPC ....... H01L 33/38; H01L 33/62; H01L 33/44; H01L 33/40; H01L 33/382; H01L 33/387; H01L 33/54; H01L 33/52
USPC ...................................................... 257/98, 99
See application file for complete search history.

(56) References Cited

U.S. PATENT DOCUMENTS

| | | | |
|---|---|---|---|
| 2011/0127568 A1 | 6/2011 | Donofrio et al. | |
| 2013/0277696 A1 | 10/2013 | Matsui et al. | |
| 2014/0124821 A1* | 5/2014 | Tomonari ................ | H01L 33/38 257/99 |
| 2015/0311415 A1* | 10/2015 | Song ..................... | H01L 27/156 257/91 |

FOREIGN PATENT DOCUMENTS

JP        2012-138499 A        7/2012

*Primary Examiner* — Thien F Tran
(74) *Attorney, Agent, or Firm* — Global IP Counselors, LLP

(57) ABSTRACT

A light emitting element includes a semiconductor stacked layer body having an n-type semiconductor layer, an active layer, and a p-type semiconductor layer in this order, and a plurality of exposed portions defined at an upper surface side of the semiconductor stacked layer body, the plurality of exposed portions respectively exposing a part of the n-type semiconductor layer, a p-side electrode arranged in a first region and electrically connected with an upper surface of the p-type semiconductor layer and, arranged at one corner above the p-type semiconductor layer in a plan view, and an n-side electrode electrically integrally connected to the plurality of exposed portions and arranged in a different region in a plan view. In a plan view, the semiconductor stacked layer body has a rectangular shape and the plurality of exposed portions includes, a plurality of first exposed portions arranged at substantially equal intervals along a side of the semiconductor stacked layer body and a plurality of second exposed portions arranged closer to the p-side electrode than the first exposed portions are to the p-side electrode. The plurality of second exposed portions include at least one second exposed portion which has a shortest distance to the first exposed portions, the shortest distance to the first exposed portions being longer than a shortest distance among the first exposed portions. The at least one second exposed portion also has a shortest distance to the p-side electrode shorter than the shortest distance among the first exposed portions.

11 Claims, 6 Drawing Sheets

LIGHT EMITTING ELEMENT AND LIGHT EMITTING DEVICE USING THE SAME

CROSS-REFERENCE TO RELATED APPLICATION

This application claims priority to Japanese Patent Application No. 2014-069816, filed on Mar. 28, 2014. The entire disclosure of Japanese Patent Application No. 2014-069816 is hereby incorporated herein by reference.

BACKGROUND

1. Technical Field

The present disclosure relates to a light emitting element and a light emitting device using the light emitting element.

2. Background Art

In order to obtain good light extraction efficiency and uniform emission in light emitting elements, various researches have been conducted on the shapes and arrangements of n-side electrodes and p-side electrodes. For example, in US 2011-0127568A1, a configuration is proposed, in which a plurality of circular regions for connecting the n-electrode to the semiconductor layer are arranged evenly in the entire light emitting region and the p-electrode is located at a side of the light emitting element.

SUMMARY OF THE INVENTION

It is an aspect of the present invention to provide a light emitting element in which deviation in luminance distribution is reduced and uniform emission can be achieved and to provide a light emitting device using the same.

The inventors conducted vigorous studies on the shapes and the arrangements of the n-side electrode and the p-side electrode in a light emitting element and have found that even when the regions (hereinafter may be referred to as "exposed portions") exposing the n-type semiconductor layer connected to the n-side electrode are uniformly arranged, the current density in the active layer may still be non-uniform, resulting in deviation in the luminance distribution. Accordingly, rather than by arranging all the exposed portions uniformly, by changing the shape and arrangement of the p-side electrode and also arranging the exposed portions adjacent to the p-side electrode differently from the uniform arrangement of other exposed portions, more uniform current density can be achieved in the active layer, thus a light emitting element with efficiently reduced deviation in luminance distribution can be obtained.

A light emitting element according to an embodiment of the present invention may include: a semiconductor stacked layer body having an n-type semiconductor layer, an active layer, and a p-type semiconductor layer in this order, and a plurality of exposed portions defined at an upper surface side of the semiconductor stacked layer body, the plurality of exposed portions respectively exposing a part of the n-type semiconductor layer, a p-side electrode electrically connected with an upper surface of the p-type semiconductor layer and in a plan view, arranged at one corner above the p-type semiconductor layer, and an n-side electrode electrically integrally connected to the plurality of exposed portions and in a plan view, arranged in a different region than a region arranged with the p-side electrode. The semiconductor stacked layer body has a rectangular shape in a plan view, and the plurality of exposed portions include, in a plan view, a plurality of first exposed portions arranged at substantially equal intervals along a side of the semiconductor stacked layer body and a plurality of second exposed portions arranged closer to the p-side electrode than the first exposed portions are to the p-side electrode. The plurality of second exposed portions include at least one second exposed portion which has a shortest distance to the first exposed portions larger than a shortest distance among the first exposed portions and which also has a shortest distance to the p-side electrode smaller than the shortest distance among the first exposed portions.

According to an embodiment, a light emitting element with reduced uneven luminance distribution and a light emitting device using the same can be realized.

DETAILED DESCRIPTION OF THE EMBODIMENTS

Figure 1A:
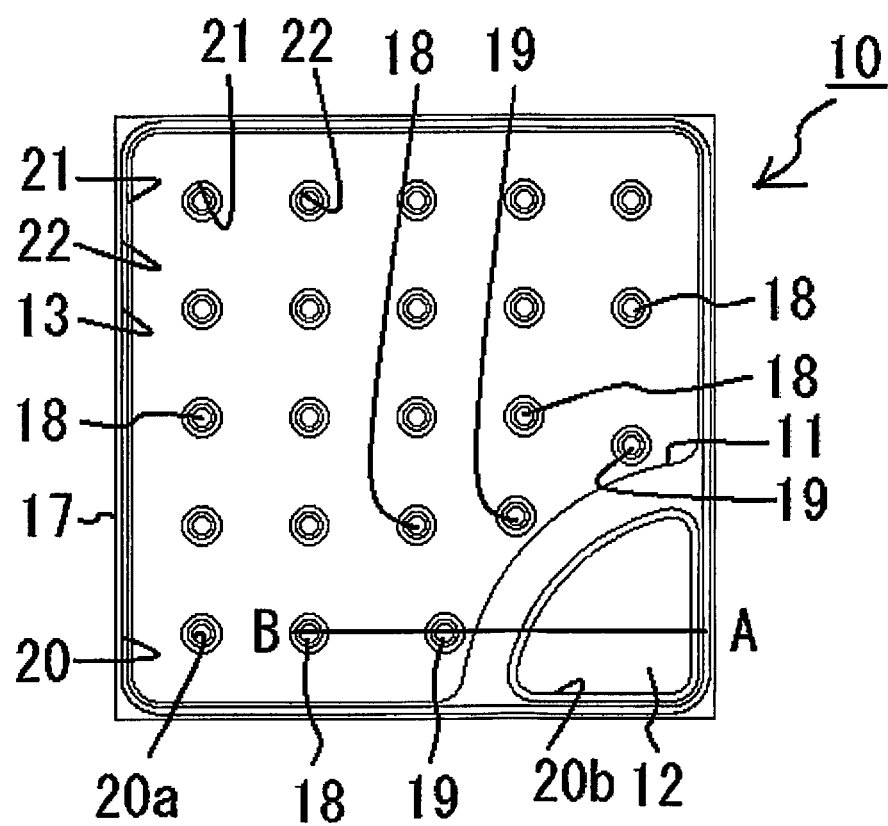
FIG. 1A is a schematic plan view showing a schematic configuration of a light emitting element according to an embodiment of the present invention.

In the description below, when appropriate, terms which indicate specific directions or locations (for example, "up", "down", "right", "left" and other terms expressing those) may be applied. But those terms are used for easy understanding of the disclosure with reference to the accompanying drawings, and thus the technical scope of the disclosure shall not be limited by the meaning of those terms. The same numerals in different drawings indicate the same or similar portions or members. For the ease of understanding, embodiments will be described separately. However, those embodiments are not independent of each other and those shareable descriptions may be appropriately applied in other embodiments.

Light Emitting Element

A light emitting element mainly includes a semiconductor stacked layer body having a rectangular planar shape and a p-side electrode and an n-side electrode disposed on the same surface side of the semiconductor stacked layer body. As a rectangular shape, a square shape is preferable. The term "rectangular shape" in the present embodiment allows a variation in an angle of ±5° at each of the four 90° corners.

(Semiconductor Stacked Layer Body)

The semiconductor stacked layer body includes an n-type semiconductor layer and a p-type semiconductor layer. The semiconductor stacked layer body preferably includes an active layer between the n-type semiconductor layer and the p-type semiconductor layer. The type and material of the n-type semiconductor layer, the active layer, and the p-type semiconductor layer are not specifically limited, and for example, a semiconductor material such as $In_XAl_YGa_{1-X-Y}N$ ($0 \leq X$, $0 \leq Y$, $X+Y<1$) can be used. For the fluorescent material, a known material in the art can be used.

(Exposed Portion)

The semiconductor stacked layer body has a plurality of exposed portions which are defined at an upper surface side and are exposing the n-type semiconductor layer. Those exposed portions are arranged, in a plan view, in a region different from a region where the p-side electrode is arranged. In other words, the exposed portions are demarcated by removing corresponding portions of the p-type semiconductor layer and the active layer stacked on the n-type semiconductor layer in the thickness direction of the layers (when appropriate, also a portion of the n-type semiconductor layer in the thickness direction). The plurality of exposed portions are used to integrally electrically connect to the n-type semiconductor layer through the n-side electrode to be described below.

The shape, size, and the positions of the exposed portions can be appropriately determined according to the intended size, shape, and connecting state of the light emitting element. It is more preferable that all the exposed portions are arranged in the same shape and size. With this arrangement, uniform amount of electric current can be supplied. As a result, uniform emission intensity can be obtained as the whole light emitting element and luminous unevenness can be suppressed. Examples of the shape of the exposed portions include, in a plan view, a circular shape or an oval shape, a polygonal shape such as triangular shape, a rectangular shape, or a hexagonal shape, and of those, a circular shape or an oval shape is preferable. The size of the exposed portions can be adjusted appropriately according to the size of the semiconductor stacked layer body, the output power, luminance, and so on of the light emitting element to obtain. The exposed portions preferably have a size of, for example, about several tens of micrometers to several hundred micrometers in the diameter (or a side). From another point of view, the diameter is preferably about 1/20 to about 1/5 of the length of a side of the semiconductor stacked layer body.

The exposed portions include a plurality of first exposed portions and a plurality of second exposed portions. The first exposed portions are arranged, in a plan view, at substantially equal intervals along a side of the semiconductor stacked layer body. In the specification, the term "equal interval" means not only that the first exposed portions are arranged at the same intervals to each other but also that a deviation of about ±5% is allowed for the intervals. The shortest distance a between the first exposed portions can be adjusted appropriately according to the size of each exposed portion, the size of the semiconductor stacked layer body, the output power, luminance, and so on of the light emitting element to be obtained. The shortest distance a between the first exposed portions (hereinafter the distance is represented by the distance from the centers of the first exposed portions and the second exposed portions respectively) may be, for example, about 2 to 8 times greater than the size (for example, the diameter) of the exposed portions, and about 4 to 6 times is preferable. From another point of view, the shortest distance a may be about 1/30 to about 1/5 with respect to a side of the semiconductor stacked layer body, and about 1/15 to about 1/5 is preferable. More specifically, in the case where the semiconductor stacked layer body has a side of 1.4 mm, the shortest distance a may be about 50 µm to about 300 µm, and about 100 µm to about 250 µm is preferable.

The first exposed portions are preferably formed at the inner sides of an edge of the semiconductor stacked layer body. The shortest distance e between the first exposed portion and an edge of the semiconductor stacked layer body may be similar to the shortest distance a between the first exposed portions or may have some degree of deviation. Among those, the shortest distance e is preferably smaller than the shortest distance a between the first exposed portions (e<a). For example, in the case where the semiconductor stacked layer body has a side of 1.4 mm, the shortest distance e may be about 25 µm to about 250 µm, and about 50 µm to about 200 µm is preferable. As described above, setting the shortest distance e in the region with a low current density smaller than the shortest distance a in the region surrounded by the first exposed portions, the deviation in the current density between the end portion of the semiconductor stacked layer body and inner portion with respect to the end portion can be reduced.

Figure 1B:
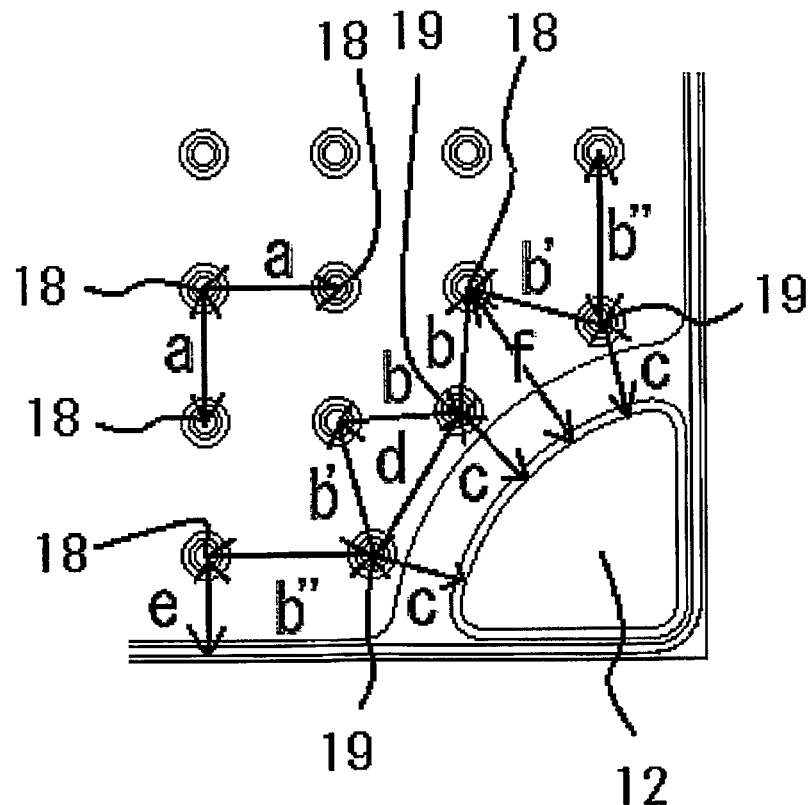
FIG. 1B is a schematic diagram showing a configuration of a light emitting element according to an embodiment of the present invention, an enlarged plan view of a main portion of the light emitting element shown in FIG. 1A.
Figure 1C:
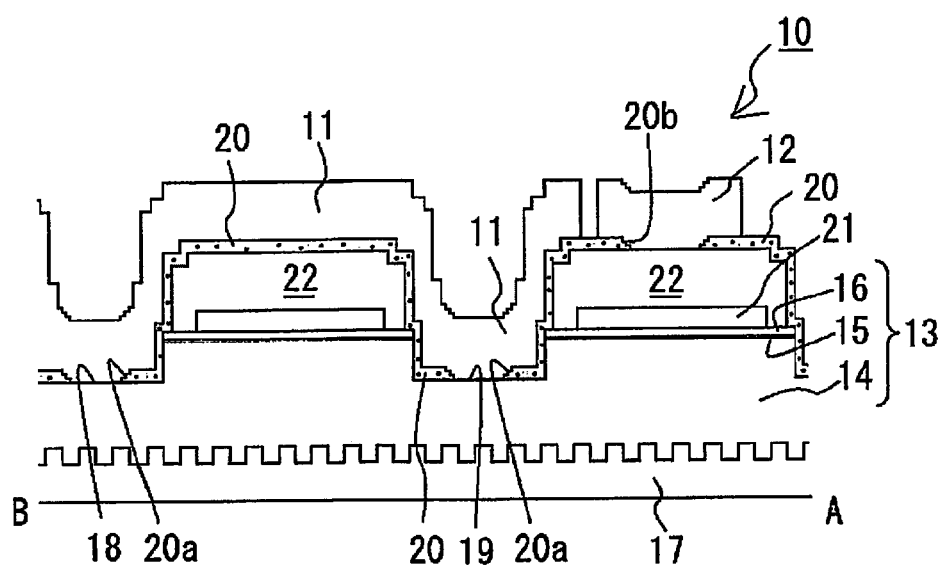
FIG. 1C is a schematic diagram showing a configuration of a light emitting element according to an embodiment of the present invention, a cross-sectional view taken along line A-B n in FIG. 1A.

The second exposed portions are arranged closer to the p-side electrode to be described below than the first exposed portions. The second exposed portions include, for example as shown in FIG. 1B, (i) the second exposed portions 19 having the shortest distance b to the first exposed portions 18 larger than the shortest distance a between the plurality of substantially equally spaced first exposed portions 18 (a<b), and (ii) the second exposed portions 19 having the shortest distance c to the p-side electrode 12 smaller than the shortest distance a between the plurality of substantially equally spaced first exposed portions 18 (a>c). The second exposed portion 19 satisfying the above can be a single one, but a plurality of them is preferable, and it is more preferable that all the second exposed portions 19 satisfy the above. As long as satisfying the aforementioned (i) and (ii), the shortest distance c between the second exposed portion and the p-side electrode may be different at each second exposed portion, but it is preferable that a part or all of the second exposed portions have the same distance. It is further preferable that the second exposed portions include a plurality of second exposed portions 19 which satisfy the aforementioned (i) and (ii) and are arranged closest to the p-side electrode 12.

In the case of arranging three or more second exposed portions, the shortest distance d between adjacent second exposed portions may be different but the same distance d is preferable. The shortest distance d is preferably larger than the shortest distance a between the first exposed portions (a<d). With this arrangement, excessive concentration of the current can be reduced in the vicinity of the p-side electrode where electric current more likely concentrates than in the region where the first exposed portions are substantially uniformly arranged. The shortest distance d between the second exposed portions may be, for example, about 2 to 10 times greater than the size (for example, the diameter) of the exposed portions, and about 2 to 8 times is preferable. From another point of view, the shortest distance d may be about $1/15$ to about $1/4$ with respect to a side of the semiconductor stacked layer body, and about $1/10$ to about $1/4$ is preferable. More specifically, in the case where the semiconductor stacked layer body has a side of 1.4 mm, the shortest distance a may be about 100 μm to about 500 μm, and about 200 μm to about 400 μm is preferable.

In other words, the second exposed portions are arranged adjacent to the p-side electrode. The expression "adjacent to the p-side electrode" means that the second exposed portions are arranged separately from the first exposed portions which are arranged at substantially equal intervals, and the shortest distance c from the second exposed portions to the p-side electrode is smaller than the shortest distance f from the first exposed portions to the p-side electrode (c<f).

For example, the shortest distance b between the second exposed portions to their closest first exposed portions may be, for example, about 1 to 6 times greater than the size (for example, the diameter) of the exposed portions, and about 2 to 5 times is preferable. From another point of view, the shortest distance b may be about 50 μm to about 300 μm, and about 100 μm to about 250 μm is preferable. For example, the shortest distance c between the second exposed portions between the second exposing portions and the p-side electrode may be about 1 to 10 times greater than the size (for example, the diameter) of the exposed portions, and about 1 to 8 times is preferable. From another point of view, the shortest distance c may be about 20 μm to about 200 μm, and about 20 μm to about 150 μm is preferable. For example, the shortest distance f between the first exposed portions and the p-side electrode may be, about 1 to 20 times greater than the size (for example, the diameter) of the exposed portions, and about 2 to 15 times is preferable. From another point of view, the shortest distance f of about 50 μm to about 400 μm is preferable.

With the arrangement of the exposed portions as described above, that is, with the uniformly arranged first exposed portions, the electric current can be spread in a region away from the second electrode. The current spreading at the p-side electrode and at its diagonal side can be balanced by arranging the second exposed portions spaced apart from the first exposed portions by a distance greater than the substantially equal intervals of the first exposed portions, in the vicinity of the p-side electrode where electric current likely concentrates. As a result, uneven distribution of electric current in the region surrounded by the first exposed portions can be reduced, and uniform current spreading can be obtained, so that distribution of emission luminance can be improved. Also, further uniform current density can be obtained in the active layer, so that the forward voltage (Vf) can also be reduced.

(Substrate)

The semiconductor stacked layer body is generally formed on a substrate for growing semiconductors. Such a substrate allows for epitaxially growing a semiconductor layers, and for example, an insulating substrate such as sapphire ($Al_2O_3$), spinel ($MgAl_2O_4$) can be employed.

As described above, in the case where the semiconductor stacked layer body has a rectangular shape in a plan view, it is preferable that the substrate also has a similar rectangular shape. Particularly, the substrate preferably has a rectangular shape which is substantially the same shape with a slightly larger planar dimension than that of the semiconductor stacked layer body. The substrate preferably has a plurality of protrusions on its surface in order to sufficiently scatter or diffract light from the semiconductor stacked layer body so as to improve luminous efficiency. Such protrusions on the surface of the substrate can be formed by using a method known in the art.

At completion of the fabrication of the light emitting element, a portion or the entire of the substrate in the thickness direction may have been removed. Removal of the substrate can be carried out by using a laser lift off method or the like. The substrate can be completely removed from the semiconductor layer, but may also remain partially at an end portion or a corner of the semiconductor layer. Also, only a portion in the thickness direction may be removed by polishing, grinding, or the like.

(N-Side Electrode and P-Side Electrode)

The semiconductor stacked layer body is provided with an n-side electrode connected to the n-type semiconductor layer and a p-type electrode connected to the p-side electrode. The n-side electrode and the p-side electrode are arranged on a first main surface side (that is, the upper surface side which is the side opposite the substrate) of the semiconductor stacked layer body. Particularly, the n-side electrode is integrally connected to the plurality of first exposed portions and the second exposed portions described above. The p-side electrode is disposed on the semiconductor stacked layer body, in particular, to a corner of the p-type semiconductor layer.

The planar shape of the first electrode and the second electrode are not specifically limited and a circular shape, an elliptical shape, a polygonal shape, a fan-like shape, a shape approximating such a shape, such a shape with a recessed portion, or the like, can be used.

Among those, the second electrode preferably has a fan-like shape which covers a corner of the p-type semiconductor layer. The size of the fan-like shape of the second electrode is not specifically limited, as long as it allows electrical connection to a corresponding external electrode. For example, a fan-like shape may have a side of about 50 μm to about 300 μm, and about 100 μm to about 300 μm is preferable.

The first electrode preferably has a rectangular shape which is slightly smaller than the shape of the semiconductor stacked layer body, to which, in order to separate the first electrode from the second electrode, a recess is provided corresponding to the fan-like shape of the second electrode. Thus, the first electrode is disposed not only on the first exposed portions and the second exposed portions, but also on the p-type semiconductor layer through an electrical insulation as described below. With the first electrode and the second electrode in such shapes, a substantially uniform current density in the active layer.

The n-side electrode and the p-side electrode can be formed with, for example, a metal such as Au, Pt, Pd, Rh, Ni, W, Mo, Cr, Tl, Al, or Cu, or an alloy of those, or a single layer or a multilayer of light-transmissive electrically conductive layer which includes at least one element selected from the group consisting of zinc, indium, tin, gallium, and magnesium. Examples of the light-transmissive electrically conductive layer include ITO, ZnO, IZO, GZO, In$_2$O$_3$, and SnO$_2$. More specifically, the n-side electrode and the p-side electrode can be formed with a stacked layer of Ti/Rh/Au, Ti/Pt/Au, W/Pt/Au, Rh/Pt/Au, Ni/Pt/Au, Al—Cu alloy/Ti/Pt/Au, Al—Si—Cu alloy/Ti/Pt/Au, Ti/Rh, Ti/Rh/Ti/Pt/Au, or the like, stacked from the semiconductor layer side. The thickness thereof can be any thickness that is used in the art.

(Electrically Conductive Layer)

The n-side electrode and the p-side electrode may be directly in contact with the n-type semiconductor layer and the p-type semiconductor layer, or may be electrically connected via an electrically conductive layer, respectively. The electrically conductive layer is not specifically limited, and for example, a reflecting layer and/or an ohmic electrode layer which is in contact with the n-type semiconductor layer or the p-type semiconductor layer can be used.

The reflecting layer may be respectively connected to the n-type semiconductor layer and the p-type semiconductor layer, or may be connected only to the p-type semiconductor layer. The reflecting layer may be connected to the n-type semiconductor layer and/or the p-type semiconductor layer via an ohmic electrode layer. For the reflecting layer, a layer which further includes silver layer or a silver alloy layer can be used. The layer made of silver or a silver alloy is preferably arranged in contact with the semiconductor layer or closest to the semiconductor layer.

As for the silver alloy, any known material in the art can be used. The thickness of the reflecting layer is not specifically limited, and a thickness which allows efficient reflection of light emitted from the semiconductor stacked layer body, for example, about 20 nm to about 1 µm can be employed. The contact area of the reflecting layer with the n-type semiconductor layer or the p-type semiconductor layer is preferably as large as possible, and for example, 50% or greater, 60% or greater, or 70% greater with respect to the planar dimension of the semiconductor stacked layer body can be employed.

In the case of using the reflecting layer as an electrically conductive layer, in order to suppress the migration of silver, an electrically conductive layer and/or a cover electrode is preferably further provided to cover the upper surface (preferably the upper surface and side surfaces) of the reflecting layer. Such an electrically conductive layer or a cover electrode which is further provided may be made of a metal or an alloy which is generally used as an electrode material, and such an electrically conductive layer may be a single layer or a multilayer of a metal or an alloy which is exemplified in the material for the first electrode and the second electrode. For example, Ni/Ti/Ru or the like is preferable. For the cover electrode, for example, a single layer or a stacked layer which includes a metal such as aluminum, copper, and/or nickel can be used, and among those, AlCu, AlCuS, or the like, can be used. As for the thickness, the further provided electrically conductive layer or the cover electrode may be, in order to efficiently suppress silver migration, about several hundred nanometers to several micrometers may be employed. As an alternative to the cover electrode, an insulating layer such as SiN may be formed. In such a case, the insulating layer is disposed on the reflecting layer with an opening defined over a part of the upper surface of the reflecting layer and also covering the side surfaces of the reflecting layer. With this, migration of silver can be suppressed and the n-side electrode and the p-side electrode can be electrically connected with the reflecting layer.

In the case of an ohmic electrode layer, a single layer or a stacked layer of at least one layer selected from the light-transmissive electrically conductive layers described above can be used.

Particularly preferably, the p-side electrode is connected to the upper surface of the p-type semiconductor layer through a first electrically conductive layer or a second electrically conductive layer. As for the first electrically conductive layer, a stacked layer structure of the reflecting layer, another electrically conductive layer which covers the reflecting layer, and a cover electrode, stacked in this order from the semiconductor layer side can be employed. As for the second electrically conductive layer, in order to secure the ohmic property (reduce the contact resistance), a stacked-layer structure may be employed, in which a light-transmissive electrically conductive layer, a reflecting layer, another electrically conductive layer which covers the reflecting layer, and a cover electrode are stacked from the semiconductor layer side. The n-side electrode can be connected to the n-type semiconductor layer without interposing the first electrically conductive layer nor the second electrically conductive layer, or the n-side electrode can be connected to the n-type semiconductor layer via the first electrically conductive layer or the second electrically conductive layer. Particularly preferably, the n-side electrode is connected to the n-type semiconductor layer through the second electrically conductive layer. That is, the second electrically conductive layer preferably includes a first light-transmissive layer which is in contact with the n-type semiconductor layer and a second light-transmissive layer which is in contact with the p-type semiconductor layer.

(Insulating Layer)

The n-side electrode, the p-side electrode and the electrically conductive layer, or the electrically conductive layer may be disposed on the semiconductor stacked layer body with an insulating layer partially interposed therebetween. The n-side electrode is electrically connected to the semiconductor stacked layer body through an exposed portion arranged on the semiconductor stacked layer structure. The n-side electrode is preferably connected to a plurality of exposed portions, preferably connected to all the exposed portions, and further preferably disposed so as to be connected to the plurality of exposed portions or all the exposed portions by integrally covering them. Accordingly, the n-side electrode may be arranged not only on the n-type semiconductor layer but also on the p-type semiconductor layer. In this case, the n-side electrode is arranged extending from the exposed portion onto the p-type semiconductor layer via the insulating layer disposed on the side surfaces (side surfaces of the active layer and the p-type semiconductor layer) of the semiconductor stacked layer body and onto the p-type semiconductor layer. Thus, with the n-side electrode integrally covering the exposed portions, the need of an electrode to be extended for connection is eliminated and a sheet resistance can be reduced. The insulating layer is not specifically limited and a material known in the art can be preferably used with a thickness which allows for securing electrical insulation.

A dielectric multilayer film, that is a DBR (distributed Bragg reflector) layer may be disposed between the n-side electrode and the p-side electrode, and between the n-type semiconductor layer and the p-type semiconductor layer, respectively with a thickness, for example, in a range not to impair the electrical connection in the first electrically conductive layer and the second electrically conductive layer. That is, a DBR layer may be disposed partially between the light-transmissive electrically conductive layer, the reflecting layer, the another electrically conductive layer, and the cover electrode, particularly, partially between the light-transmissive electrically conductive layer and the reflecting layer. In other words, the second electrically conductive layer may include a dielectric multilayer films formed on the first light-transmissive layer so as to partially expose the first light-transmissive layer. Also, the second electrically conductive layer may include a dielectric multilayer films formed on the second light-transmissive layer so as to partially expose the second light-transmissive layer. A DBR layer has, for example, a multilayer structure in which a pair of dielectrics made of a low refractive index layer and a high refractive index layer is stacked in plurality (for example, 2 to 5) on an appropriate underlayer made of an oxide layer for example so as to selectively reflect light of a predetermined wavelength. More specifically, alternately stacking layers of different refractive indices with a thickness of one fourth of the wavelength allows reflecting a predetermined wavelength with high efficiency. For the DBR layer, an oxide or a nitride of at least one element selected from the group consisting of Si, Ti, Zr, Nb, Ta, and Al can be used. In the case of forming the DBR layer with an oxide layer, the low refractive index layer can be, for example, $SiO_2$ and the high refractive index layer can be, for example, $Nb_2O_5$, $TiO_2$, $ZrO_2$, or $Ta_2O_5$. More specifically, the DBR layer can be $(Nb_2O_3/SiO_2)_n$, in which n is 2 to 5, in order from the underlayer side. The DBR preferably has a total thickness of about 0.2 μm to about 1 μm.

Light Emitting Device

The light emitting device according to an embodiment includes the light emitting element described above and a base member which has a wiring pattern on its surface. The light emitting device may optionally include a resin which has light-reflecting property, a light-transmissive property, a light shielding property, or the like, or such a resin added with a fluorescent material, a light diffusing material, a coloring agent, or the like, disposed on one or more side surfaces, an upper surface or a lower surface (that is, one or more side surfaces, an upper surface or a lower surface of the base member). Any materials used in the art can be used for such a resin, fluorescent material or the like. Among those, the light emitting device preferably includes a light-transmissive member which covers the light emitting element. In the embodiment, each of the light emitting elements 30 is, as shown in FIG. 3, mounted on the substrate member 10 in a flip-chip manner. In this case, generally, the n-side electrode and the p-side electrode of the light emitting element are joined with the wiring pattern of the base member by a joining member. As for the joining member, any known material in the art can be used.

(Base Member)

The base member includes a base material made of, for example, a metal, a ceramic, a resin, a dielectric, a pulp, a glass, a paper, or a composite material of those (for example, a composite resin), or a composite material of such a material and an electrically conductive material (for example, a metal, a carbon, or the like), and a plurality of wiring patterns disposed on one or more surfaces, optionally inside and/or on a back surface of the base material.

The wiring pattern is for supplying electric current to the light emitting element, and can be made with a material, a thickness, and a shape which are generally employed in the art. Also, a joining member for mounting to be connected with the n-side electrode and the p-side electrode as described above may be arranged on a portion of the wiring pattern.

(Resin)

For such a resin, a thermosetting resin, a thermoplastic resin, a modified resin of such a resin, a hybrid resin which includes one or more of those resins, or the like, can be used. In order to provide a light-reflecting property, a light-transmissive property and/or a light shielding property, for example, $TiO_2$, $SiO_2$, carbon black, a fluorescent material known in the art, or the like, may be contained in such a resin.

In order to dispose such a resin as a light-transmissive member which covers the light emitting element, a printing method, an electrophoretic deposition method, a potting method, a compression molding method, a spraying method, an electrostatic coating method, or the like, can be used. Particularly, the light-transmissive member preferably covers the base member together with the base member. Further, a planar dimension of the portion which covers the light emitting element is preferably greater than the planar dimension of the portion which covers the base member. Examples of such a shape include a quadrangular prism shape with a hemispherical shape placed on its upper surface.

Embodiments of a light emitting element and a light emitting device using the same will be described in detail below with reference to accompanying drawings.

Embodiment 1

Light Emitting Element

The light emitting element 10 according to Embodiment 1 includes, as shown in FIG. 1A to FIG. 1D, a semiconductor stacked layer body 13 having an approximately square shape in a plan view, an n-side electrode 11 and a p-side electrode 12 respectively connected to corresponding portions on a same surface side of the semiconductor stacked layer body 13. The length of one side of the light emitting element 10 is 1.4 mm.

The semiconductor stacked layer body 13 is constituted with an n-type semiconductor layer 14, an active layer 15, and a p-type semiconductor layer 16 disposed in this order on a sapphire substrate which has an approximately square shape in a plan view with a protrusion-recess shape on its upper surface.

The semiconductor stacked layer body 13 has a plurality of exposed portions on its inward side, where portions of the p-type semiconductor layer 16 and the active layer 15 are removed to expose corresponding portions of the n-type semiconductor layer 14. The exposed portions include, in a plan view, nineteen first exposed portions 18 arranged with substantially equal intervals along a side of the semiconductor stacked layer body 13 and three second exposed portions 19. The first exposed portions 18 may be arranged in a similar manner as in a matrix of five by five at substantially equal intervals, with six at a corner have been removed. The second exposed portions 19 may be arranged closer to the p-side electrode 12 to be described below than the first exposed portions 18. Each of the second exposed portions 19 has a shortest distance b to the first exposed portions 18 larger than the shortest distance a between the first exposed portions 18, and further, the shortest distance c to the p-side electrode 12 is smaller than the shortest distance a. In the present embodiment, all the second exposed portions 19 have substantially the same shortest distance c to the p-side electrode 12.

The first exposed portions 18 and the second exposed portions 19 have a circular shape with a diameter of about 60 μm. With this arrangement, the n-side electrode is connected to the semiconductor stacked layer body 13 with about 5% (as a total planar dimension of the exposed portions) of the planar dimension of the semiconductor stacked layer body 13.

As shown in FIG. 1B, in a plan view, the shortest distance a between the first exposed portions 18 is smaller (for example, smaller by a radius of an exposed portion) than ⅙ (denominator is a number of array plus one) in the present embodiment, which may vary according to the number of the arrays, with respect to the length of one side of the semiconductor stacked layer body 13. More specifically, the shortest distance e can be about 250 μm. The shortest distance b between the first exposed portions 18 and the second exposed portions 19 can be about 230 μm. Thus, the shortest distance a>the shortest distance b. The shortest distance b' between the first exposed portions 18 and the second exposed portions 19 can be about 260 μm. The shortest distance b" between the first exposed portions 18 and the second exposed portions 19 can be about 310 μm. That is, shortest distance b, b">shortest distance a. Thus, the shortest distance b'<the shortest distance b". In the case where the shortest distance b and the distance b" are approximately the same, the electric current near the p-side electrode can be made substantially uniform to obtain a substantially uniform current density.

The shortest distance c between the second exposed portion 19 and the p-side electrode 12 is about 170 μm. The shortest distance c is smaller than the shortest distance a. That is: shortest distance c>shortest distance a.

The shortest distance f between the first exposed portion 18 and the p-side electrode 12 is larger than the shortest distance c between the second exposed portion 19 and the p-side electrode 12. More specifically, the shortest distance f is about 330 μm. The shortest distance e between the first exposed portion 18 and an edge of the semiconductor stacked layer body 13 is smaller than the shortest distance a between the first exposed portion 18. More specifically, the shortest distance e can be about 160 μm.

The n-side electrode 11 may be integrally connected to the plurality of first exposed portions 18 and a plurality of second exposed portions 19 respectively exposing the n-type semiconductor layer 14 as described above, and arranged over the semiconductor stacked layer body 13 that is, over the p-type semiconductor layer 16, via the insulating layer 20 (thickness of about 600 nm) made of SiO₂. The n-side electrode 11 is preferably not arranged over the p-side electrode 12 and its surrounding portion. The insulating layer 20 may be disposed on the side surfaces of the semiconductor stacked layer body 13 reaching the first exposed portions 18 and the second exposed portions 19, and onto a portion of the first exposed portions 18 and the second exposed portions 19 (the exposed portions of the upper surface of the n-type semiconductor layer 14). The insulating layer 20 defines a plurality of through-holes 20a of the first exposed portions 18 and the second exposed portions 19 which expose portions of the upper surface of the n-type semiconductor layer 14 and one through-hole 20b which exposes a portion of the upper surface of the p-type semiconductor layer 16. The n-side electrode 11 is connected to the first exposed portions 18 and the second exposed portion 19 at the through-holes 20a.

Figure 1D:
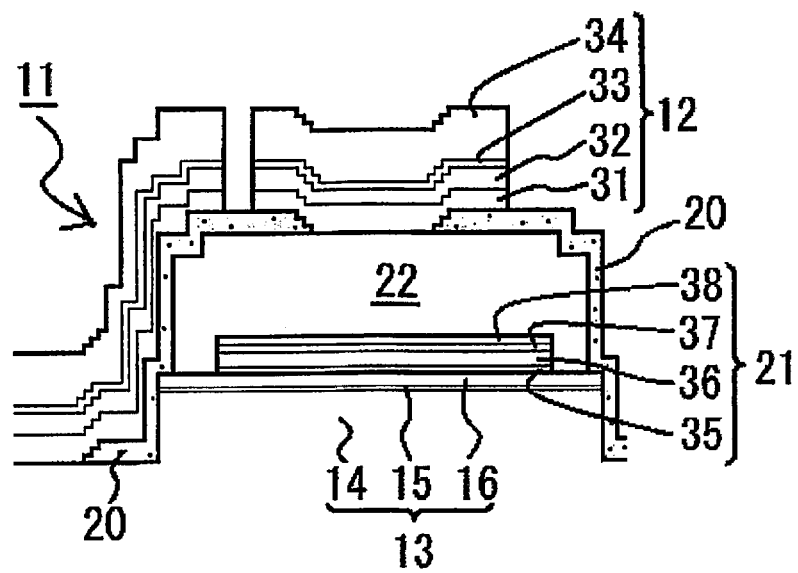
FIG. 1D is a schematic diagram showing a configuration of a light emitting element according to an embodiment of the present invention, an enlarged plan view of a main portion of the light emitting element shown in FIG. 1C.
Figure 2A:
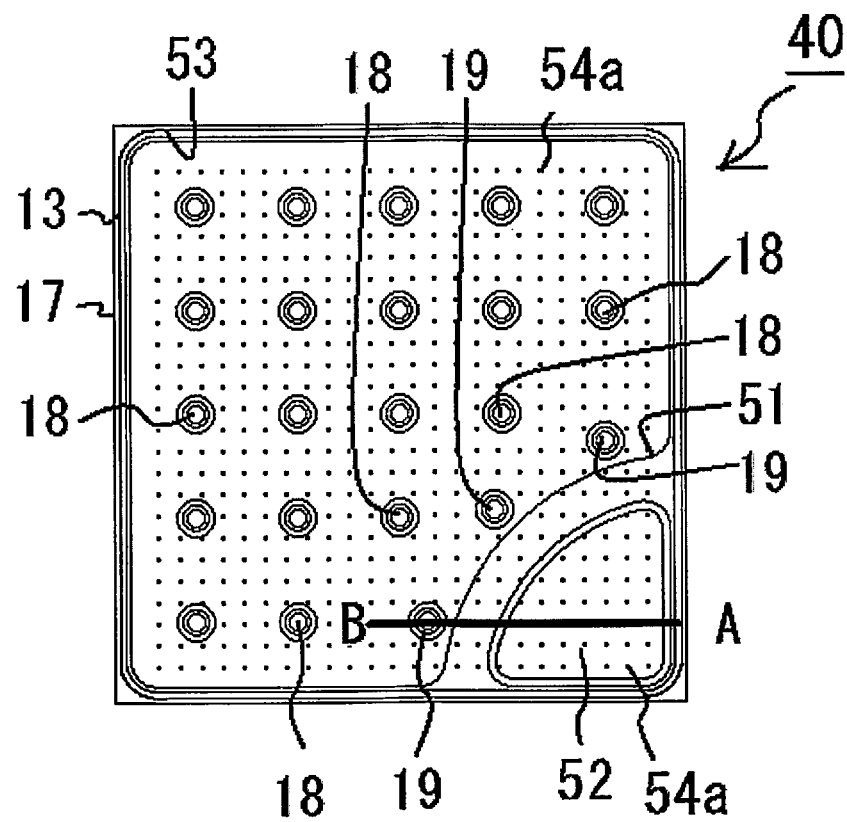
FIG. 2A is a schematic plan view showing a schematic configuration of a light emitting element according to another embodiment of the present invention.
Figure 2B:
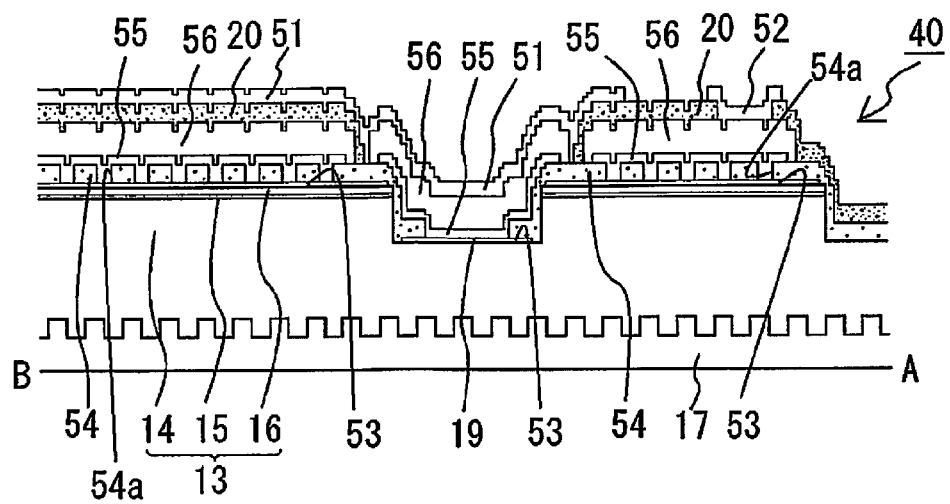
FIG. 2B is a schematic diagram showing a configuration of a light emitting element according to another embodiment of the present invention, an enlarged plan view of a main portion of the light emitting element shown in FIG. 2A.

The n-side electrode 11 is, for example, as shown in FIG. 1D, a stacked layer of an Al—Si—Cu alloy layer 31, a Ti layer 32, a Pt layer 33, and an Au layer 34 (respective thickness of about 350 nm, about 300 nm, about 200 nm, and about 450 nm) formed from the semiconductor layer side.

The p-side electrode 12 is preferably disposed in a fan-like shape on the semiconductor stacked layer body 13, that is, to a corner of the p-type semiconductor layer 16. The length of a side of the fan-like shape may be about one fifth of the length of a side of the semiconductor stacked layer body 13, and is, for example, about 300 μm. The p-side electrode 12 is, in a similar manner as in the n-side electrode 11, a stacked layer of an Al—Si—Cu alloy layer 31, a Ti layer 32, a Pt layer 33, and an Au layer 34 (respective thickness of about 350 nm, about 300 nm, about 200 nm, and about 450 nm) formed from the semiconductor layer side.

The p-side electrode 12 is preferably electrically connected to the p-type semiconductor layer 16 via the electrically conductive layer 21 (a thickness of about 600 nm) which has a light-reflecting property and formed on approximately the entire surface of the p-type semiconductor layer 16 and a cover electrode 22 (a thickness of about 2 μm) which is made of an Al—Cu alloy and covers side surfaces and the upper surface of the light-reflecting electrically conductive layer 21. The electrically conductive layer 21 is, for example, as shown in FIG. 1D, made of a stacked layer of an Ag layer 35, a Ni layer 36, a Ti layer 37, and a Ru layer 38 (respective thickness of about 100 nm, about 300 nm, about 200 nm, and about 100 nm) formed from the semiconductor layer side. Those electrically conductive layer 21 and the cover electrode 22 are connected to the semiconductor stacked layer body 13 with about 90% of the planar dimension of the semiconductor stacked layer body 13. With such a light-reflecting electrically conductive layer 21, the light extraction efficiency of the light emitted from the active layer can be improved. Also, with the cover electrode 22, migration of silver can be used effectively.

Embodiment 2

Light Emitting Element

The light emitting element 40 according to Embodiment 2 includes, as shown in FIG. 1A to FIG. 1D, a semiconductor stacked layer body 13 having an approximately square shape in a plan view, an n-side electrode 51 and a p-side electrode 52 respectively connected to corresponding portions on a same surface side of the semiconductor stacked layer body 13. The configurations of the sapphire substrate 17 and the semiconductor stacked layer body 13 are similar to the configuration of the light emitting element 10. The first exposed portions 18 and the second exposed portion 19 are, in a plan view, arranged in a similar manner as in the light emitting element 10 of Embodiment 1.

A light-transmissive electrically conductive layer 53 (a thickness of about 0.1 μm) of an ITO is disposed on approximately the entire surfaces of the first exposed portions 18 and the second exposed portions 19 and on approximately the entire upper surface of the p-type semiconductor layer 16.

A DBR layer 54 (Nb₂O₃/SiO₂)₃ (having a preferable thickness of about 1 μm) may be disposed on the semiconductor stacked layer body 13 and the light-transmissive electrically conductive layer 53. The DBR layer 54 preferably covers the side surfaces of the semiconductor stacked layer body 13 and extends to the first exposed portions 18 and the second exposed portions 19 so that exposed portions of the light-transmissive electrically conductive layer 53 on the first exposed portions 18 and the second exposed portions 19. On the p-type semiconductor layer 16, the DBR layer 54 defines the throughholes 54a which are arranged in a matrix manner at substantially equal intervals (diameter of about 10 μm and intervals of about 50 μm) in a plan view.

On the DBR layer 54, a light-reflecting electrically conductive layer 55 (a thickness of about 600 nm) is preferably disposed on the first exposed portions 18. A cover electrode 56 (a thickness of about 2 μm) made of an Al—Cu alloy and covering the side surfaces and the upper surface of the light-reflecting electrically conductive layer 55 is preferably disposed on the second exposed portions 16. The light-reflecting electrically conductive layer 55 is connected to the light-transmissive electrically conductive layer 53 which is exposed from the DBR layer 54 on the first exposed portions 18 and the second exposed portions 19. The light-reflecting electrically conductive layer 55 and the cover electrode 56 are electrically connected to the p-type semiconductor layer 16 through a through-hole 54a of the DBR layer 54. The light-reflecting electrically conductive layer 21 is formed with the stacked layer shown in FIG. 1D.

On the cover electrode 56, the insulating layer 20 (thickness of about 600 nm) made of $SiO_2$ is preferably formed. The cover electrode 56 which is over the first exposed portion 18 and the second exposed portion 19 is approximately entirely exposed from the insulating layer 20. With the exception of the portion of the cover electrode 56 which is connected to the p-side electrode 52, the insulating layer 20 covers the side surfaces and the upper surface of the cover electrode 56 above the p-type semiconductor layer 16.

The n-side electrode 51 is electronically connected to the cover electrode 56 above the first exposed portions 18 and the second exposed portions 19, which are respectively exposed from the insulating layer 20. The n-side electrode 51 is also arranged above the p-type semiconductor layer 16 via the insulating layer 20, but the n-side electrode 51 is not arranged on the p-side electrode 52 and the portion around the p-side electrode 52. The n-side electrode 51 is, for example, a stacked layer of a Ti layer, a Rh layer, a T layer, a Pt layer and an Au layer (with respective thicknesses of about 160 nm, about 100 nm, about 200 nm, about 200 nm, and about 450 nm) formed starting from the semiconductor layer side. The n-side electrode 51 is electrically connected to the n-type semiconductor layer 14 via the cover electrode 56, the light-reflecting electrically conductive layer 55 and the light-transmissive electrically conductive layer 53.

The p-side electrode 52 may be disposed in a fan-like shape on the semiconductor stacked layer body 13, in other words, disposed on a corner of the p-type semiconductor layer 16. This p-side electrode 52 as previously described and the connecting portion are electrically connected to the cover electrode 56. The cover electrode is exposed from the insulating layer 20. The p-side electrode 52 can be, in a similar manner as in the n-side electrode 51, made of a stacked layer of a Ti layer, a Rh layer, a Ti layer, and an Au layer (having respective thicknesses of about 160 nm, about 100 nm, about 200 nm, about 200 nm, and about 450 nm) formed starting from the semiconductor layer side. The p-side electrode 52 is electrically connected to the p-type semiconductor layer 16 via the cover electrode 56, the light-reflecting electrically conductive layer 55 and the light-transmissive electrically conductive layer 53.

Evaluation of Light Emitting Element

Figure 3A:
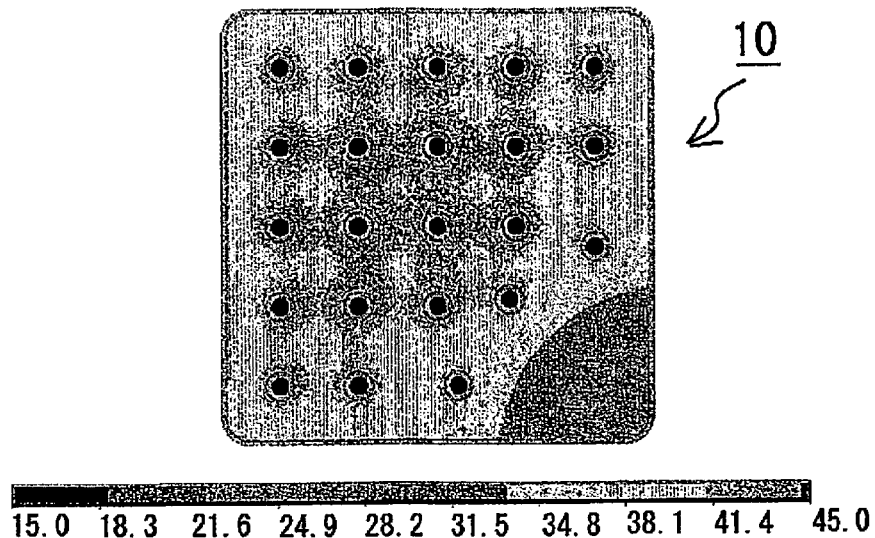
FIG. 3A is a diagram showing a simulation result of electron current density distribution of a light emitting element according to an embodiment of the present invention.
Figure 3B:
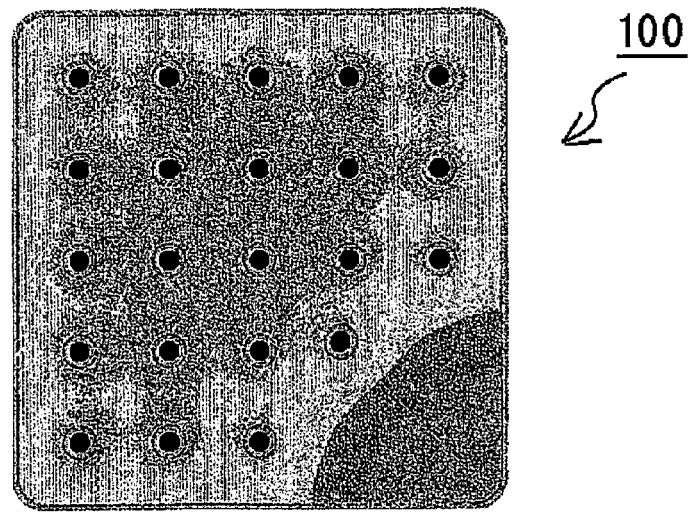
FIG. 3B is a diagram showing a simulation result of electron current density distribution of a light emitting element for comparison.
Figure 3C:
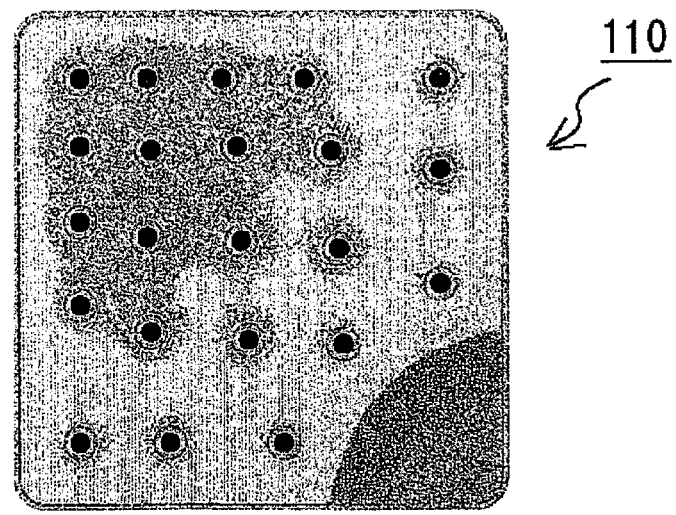
FIG. 3C is a diagram showing a simulation result of electron current density distribution of another light emitting element for comparison.

On the light emitting element 10 of Embodiment 1, the light emitting element 100 and the light emitting element 110 for comparison respectively shown in FIG. 3B and FIG. 3C, the distribution of the current density was analyzed by using simulation software which employs a finite element method. The results are shown in FIG. 3A to 3C respectively.

In FIGS. 3A to 3C, the darker the shade (higher value in the color bar), the higher the current density.

The light emitting element 100 is provided with 21 exposed portions which are arranged at substantially equal intervals except for an exposed portion which is closest to the p-side electrode on a diagonal line passing through the p-side electrode of the light emitting element 100. Further, the light emitting element 100 is provided with an exposed portion arranged on a diagonal line passing through the p-side electrode of the light emitting element 100 at a location slightly away from the p-side electrode with respect to the interval of the exposed portions. Three exposed portions located closer to the p-side electrode have a longer distance corresponding to the shortest distance b between the first exposed portion and the second exposed portion. The longer distance is longer than the shortest distance (corresponding to a) among the 21 exposed portions described above. These same three portions also have a second distance corresponding to the shortest distance c between the p-side electrode and the second exposed portion, which is longer than the shortest distance (corresponding to a) among the 21 exposed portions described above. The light emitting device 100 has a configuration substantially similar to that of the light emitting devices 10 and 40.

In the light emitting element 110, each of the exposed portions is arranged closer to the exposed portion which is the farthest from the p-side electrode. In this way, as a whole, the exposed portions are distributed in higher density in the opposite direction. Three exposed portions located closer to the p-side electrode have a larger distance corresponding to the shortest distance b between the first exposed portion and the second exposed portion, and also a larger distance corresponding to the shortest distance c between the p-side electrode and the second exposed portion, respectively than the shortest distance (corresponding to a) among the 21 exposed portions described above. The light emitting device 100 has a configuration substantially similar to that of the light emitting devices 10 and 40.

As shown in FIGS. 3A to 3C, in the light emitting element 10, as compared to the light emitting element 100, the electric current can be spread in a region away from the second electrode due to the first exposed portions which are uniformly arranged. Generally, the electric current tends to be relatively concentrated near the p-side electrode. The current spreading at the p-side electrode and at its diagonal side can be balanced by arranging the second exposed portions near the p-side electrode and spaced apart from the first exposed portions by a distance greater than the substantially equal intervals of the first exposed portions. As a result, it was confirmed that uneven distribution of electric current in the region surrounded by the first exposed portions can be reduced, and uniform current spreading can be obtained. Further, in the light emitting element 10, as compared to the uneven distribution in arrangement of the exposed portions in the light emitting element 110, the current spreading at the p-side electrode and at its diagonal side can be balanced. As a result, it was confirmed that uneven distribution of electric current was obtained.

On the light emitting element 10, the light emitting element 100, and the light emitting element 110, the forward voltage (Vt) was measured by applying a current of 350 mA. As a result, about a 0.6% decrease in the Vf value was confirmed in the light emitting element 10 compared to that in the light emitting element 100. The Vf value of the light emitting element 110 was similar to that of the light emitting element 100. As described above, it was confirmed that the forward voltage (Vf) can also be reduced by the further uniform current density in the active layer.

Embodiment 3

Light Emitting Device

Figure 4A:
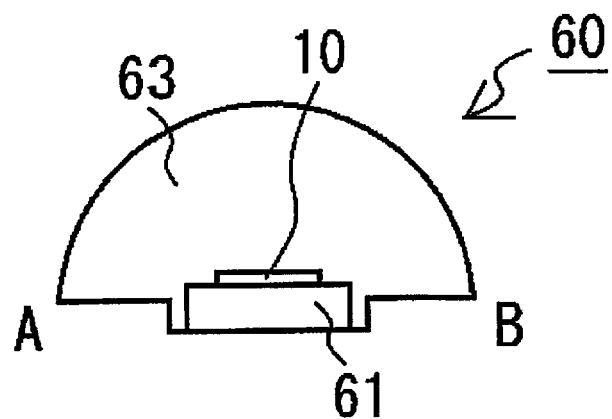
FIG. 4A is a schematic diagram showing a configuration of a light emitting device using a light emitting element according to an embodiment of the present invention, showing a cross-sectional view taken along line A-B in FIG. 4B.
Figure 4B:
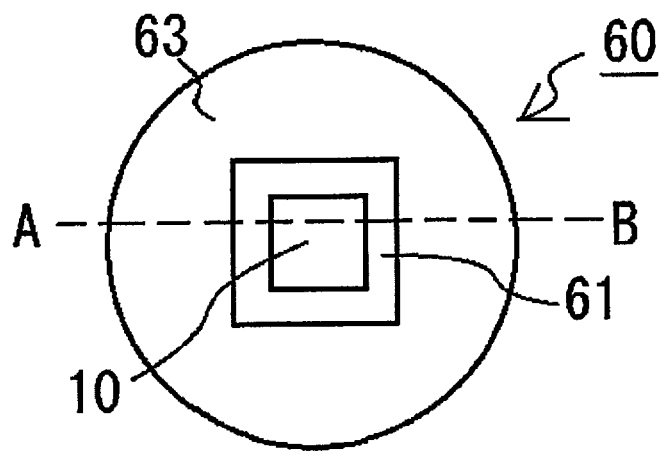
FIG. 4B is a schematic diagram showing a configuration of a light emitting element which uses a light emitting element according to an embodiment of the present invention, showing a plan view of the light emitting device shown in FIG. 4A.
Figure 4C:
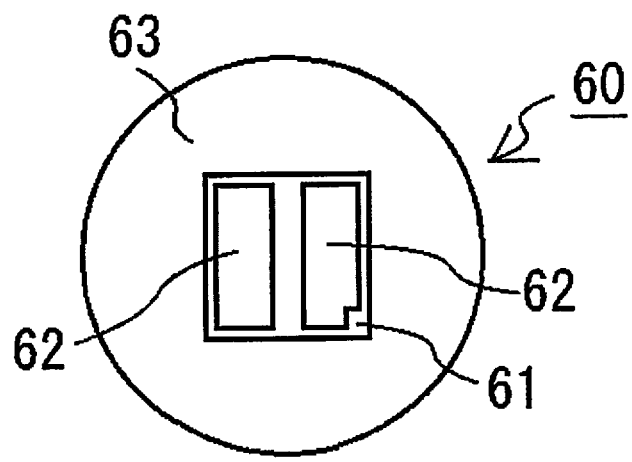
FIG. 4C is a schematic diagram showing a configuration of a light emitting element which uses a light emitting element according to an embodiment of the present invention, showing a back view of the light emitting device shown in FIG. 4A.

As shown in FIGS. 4A to 4C, the light emitting device 60 includes the light emitting element 10 according to Embodiment 1, and a base member 61 which has a wiring pattern on its surface. The wiring pattern includes a pair of patterns being a positive pattern and a negative pattern. Preferably, auxiliary patterns further connect the positive pattern and the negative pattern.

In order to mount a light emitting element in a face-down manner, the n-side electrode 11 and the p-side electrode 12 of the light emitting element 10 are respectively connected to the corresponding wiring patterns of the base member 61 via a joining member. In this case, the joining member may be disposed not at the light emitting element 10 side but at the wiring pattern side of the base member 61.

In the light emitting device 60, the light emitting element 10 is covered with the light-transmissive member 63. The sealing member 63 is, for example, made of a silicone resin containing a fluorescent material (for example a YAG-based fluorescent material). The light-transmissive member 63 covers the side surfaces of the base member 61 together with the light emitting element 10. The light-transmissive member 63 has a planar dimension of the portion which covers the light emitting element 10 larger than the planar dimension of the portion which covers the base member 61, and has a mushroom shape. That is, the light-transmissive member has a hemispherical shape from the sides upward of the light emitting element 10. On the back surface of the base member 61, a pair of positive and negative terminals 62 are arranged with approximately similar size. Such a light emitting device uses the light emitting element described above, so that substantially uniform emission with little deviation in luminance distribution can be realized.

The light emitting element according to certain embodiments of the present invention can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting element comprising:
   a semiconductor stacked layer body having an n-type semiconductor layer, an active layer, and a p-type semiconductor layer in this order, and a plurality of exposed portions defined at an upper surface side of the semiconductor stacked layer body, the plurality of exposed portions respectively exposing a part of the n-type semiconductor layer;
   a p-side electrode arranged in a first region and electrically connected with an upper surface of the p-type semiconductor layer and arranged at one corner above the p-type semiconductor layer in a plan view; and
   an n-side electrode electrically integrally connected to the plurality of exposed portions and arranged in a second region in a plan view;
   wherein the semiconductor stacked layer body has a rectangular shape in a plan view, and
   the plurality of exposed portions includes, in a plan view, a plurality of first exposed portions arranged at substantially equal intervals along a side of the semiconductor stacked layer body and a plurality of second exposed portions arranged closer to the p-side electrode than the first exposed portions are to the p-side electrode,
   the plurality of second exposed portions include at least one second exposed portion which has a shortest distance to the first exposed portions which is longer than a shortest distance among the first exposed portions; and the plurality of second exposed portions also include a shortest distance to the p-side electrode which is shorter than the shortest distance among the first exposed portions.

2. The light emitting element according to claim 1, wherein in a plan view, the shortest distance among the adjacent first exposed portions is shorter than the shortest distance among the adjacent second exposed portions.

3. The light emitting element according to claim 1, wherein the n-side electrode extends to the p-type semiconductor layer through an insulating layer.

4. The light emitting element according to claim 1, wherein the p-side electrode is connected to the upper surface of the p-type semiconductor layer through a first electrically conductive layer.

5. The light emitting element according to claim 4, wherein the first electrically conductive layer comprises a silver-containing layer which is in contact with the p-type semiconductor layer.

6. The light emitting element according to claim 1, wherein the p-side electrode is connected to the p-type semiconductor layer through a second electrically conductive layer, and the n-side electrode is connected to the plurality of exposed portions through the second electrically conductive layer.

7. The light emitting element according to claim 6, wherein the second electrically conductive layer comprises a first light-transmissive layer which is in contact with the n-type semiconductor layer and a second light-transmissive layer which is in contact with the p-type semiconductor layer.

8. The light emitting element according to claim 7, wherein the second electrically conductive layer includes a dielectric multilayer film is formed on the first light-transmissive layer so as to partially expose the first light-transmissive layer and on the second light-transmissive layer so as to partially expose the second light-transmissive layer.

9. A light emitting device comprising:
   the light emitting element according to claim 1;
   a base member having a wiring pattern on a surface; and
   a light-transmissive member covering the light emitting element.

10. The light emitting device according to claim 9, wherein the light-transmissive member covers both the base member and the light emitting element.

11. The light emitting device according to claim 9, wherein the light-transmissive member includes a first portion which covers the light emitting element; a second portion which covers the base member; and wherein the first portion has a larger planar dimension than the second portion.

\* \* \* \* \*